(12) United States Patent
Lin et al.

(10) Patent No.: US 10,373,932 B2
(45) Date of Patent: Aug. 6, 2019

(54) STACKED SEMICONDUCTOR STRUCTURE

(71) Applicant: NANYA TECHNOLOGY CORPORATION, New Taipei (TW)

(72) Inventors: Po-Chun Lin, Changhua County (TW); Chin-Lung Chu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 166 days.

(21) Appl. No.: 15/491,995

(22) Filed: Apr. 20, 2017

(65) Prior Publication Data

US 2018/0308823 A1    Oct. 25, 2018

(51) Int. Cl.
   *H01L 23/00*        (2006.01)
   *H01L 25/065*       (2006.01)
   *H01L 25/00*        (2006.01)

(52) U.S. Cl.
   CPC .......... *H01L 25/0657* (2013.01); *H01L 24/24* (2013.01); *H01L 24/32* (2013.01); *H01L 24/82* (2013.01); *H01L 24/83* (2013.01); *H01L 25/50* (2013.01); *H01L 24/92* (2013.01); *H01L 2224/24145* (2013.01); *H01L 2224/24225* (2013.01); *H01L 2224/24226* (2013.01); *H01L 2224/24997* (2013.01); *H01L 2224/32059* (2013.01); *H01L 2224/32145* (2013.01); *H01L 2224/32225* (2013.01); *H01L 2224/83192* (2013.01); *H01L 2224/92244* (2013.01); *H01L 2225/06524* (2013.01); *H01L 2225/06527* (2013.01); *H01L 2225/06551* (2013.01); *H01L 2225/06562* (2013.01);

(Continued)

(58) Field of Classification Search
   CPC ..... H01L 25/0657; H01L 24/32; H01L 24/83; H01L 2224/2762; H01L 2224/32145; H01L 2224/32225; H01L 2224/8312; H01L 2224/83201; H01L 2225/06527; H01L 2225/06551; H01L 2225/06562; H01L 2225/06586
   See application file for complete search history.

(56) References Cited

U.S. PATENT DOCUMENTS 7,550,857 B1   6/2009   Longo et al.
8,331,121 B2 * 12/2012   Hong ................. G11C 5/06
                                             365/51

(Continued)

FOREIGN PATENT DOCUMENTS

TW              201203500 A    1/2012

*Primary Examiner* — Timor Karimy
(74) *Attorney, Agent, or Firm* — CKC & Partners Co., LLC

(57) ABSTRACT

A stacked semiconductor structure is provided. The stacked semiconductor structure includes a substrate, a first electronic component, a first fillet, and a first redistribution layer. The substrate has a support surface. The substrate includes a first pad disposed on the support surface. The first electronic component is disposed on the support surface and has a first bottom surface, a first top surface, and a first side surface connecting the first bottom surface and the first top surface. The first electronic component includes a second pad disposed on the first top surface. The first fillet is disposed on the support surface and the first side surface and has a first inclined surface. The first redistribution layer is disposed on the support surface, the first top surface, and the first inclined surface and electrically connecting the first pad to the second pad.

18 Claims, 8 Drawing Sheets

(52) U.S. Cl.
CPC .............. *H01L 2225/06565* (2013.01); *H01L 2225/06586* (2013.01); *H01L 2924/15311* (2013.01); *H01L 2924/37001* (2013.01)

(56) References Cited

U.S. PATENT DOCUMENTS

| | | | |
|---|---|---|---|
| 8,749,040 B2* | 6/2014 | Chi | .................... H01L 25/0657 257/686 |
| 2010/0140811 A1* | 6/2010 | Leal | ........................ H01L 24/24 257/777 |

\* cited by examiner

STACKED SEMICONDUCTOR STRUCTURE

BACKGROUND

Technical Field

The present disclosure relates to a stacked semiconductor structure.

Description of Related Art

With the rapid growth of electronic industry, the R & D of electronic products is gradually directed to the pursuit of versatile and high performance. In order to achieve the requirements of high integration and miniaturization of semiconductor components, the requirements of the package structure also increase.

To further improve various characteristics of a package structure, persons in the industry all endeavor to search the solutions. How to provide a package structure with better characteristics is one of the important research topics, and is also a target that needs to be improved in the related fields.

SUMMARY

This disclosure provides a stacked semiconductor structure to enhance the yield of the stacked semiconductor structure and reduce the size and the manufacturing cost of the stacked semiconductor structure.

In one aspect of the disclosure, a stacked semiconductor structure is provided. The stacked semiconductor structure includes a substrate, a first electronic component, a first fillet, and a first redistribution layer. The substrate has a support surface. The substrate includes a first pad disposed on the support surface. The first electronic component is disposed on the support surface and has a first bottom surface, a first top surface, and a first side surface connecting the first bottom surface and the first top surface. The first electronic component includes a second pad disposed on the first top surface. The first fillet is disposed on the support surface and the first side surface and has a first inclined surface. The first redistribution layer is disposed on the support surface, the first top surface, and the first inclined surface and electrically connecting the first pad to the second pad.

In one or more embodiments, the substrate further includes a body and at least one second redistribution layer disposed in the body.

In one or more embodiments, the stacked semiconductor structure further includes a plurality of solder balls disposed on a surface of the substrate opposite to the support surface.

In one or more embodiments, the stacked semiconductor structure further includes a package member disposed on the support surface and covering the first electronic component.

In one or more embodiments, the first electronic component is a chip.

In one or more embodiments, the first fillet covers the first side surface.

In one or more embodiments, at least a part of the first side surface is exposed by the first fillet.

In one or more embodiments, the first redistribution layer is further disposed on the first side surface.

In one or more embodiments, the stacked semiconductor structure further includes a die attachment disposed between the support surface and the first bottom surface, wherein the die attachment and the first fillet are made of the same material.

In one or more embodiments, the stacked semiconductor structure further includes a second electronic component and a second fillet. The second electronic component is disposed on the first top surface and has a second bottom surface, a second top surface, and a second side surface connecting the second bottom surface and the second top surface. The second electronic component includes a third pad disposed on the second top surface. The second fillet is disposed on the second side surface and has a second inclined surface.

In one or more embodiments, the second fillet is further disposed on the first top surface, and the first redistribution layer is further disposed on the second inclined surface and the second top surface and further electrically connected to the third pad.

In one or more embodiments, the second fillet is further disposed on the first inclined surface. The stacked semiconductor structure further includes a second redistribution layer disposed on the second inclined surface and the second top surface and electrically connecting the first pad to the third pad.

In one or more embodiments, the first redistribution layer is electrically connected to the second redistribution layer.

In one or more embodiments, the first redistribution layer is electrically isolated from the second redistribution layer.

In one or more embodiments, an orthogonal projection of the first electronic component on the substrate and an orthogonal projection of the second electronic component on the substrate are substantially the same.

In one or more embodiments, a substantial portion of an orthogonal projection of the second electronic component on the substrate does not overlap with an orthogonal projection of the first electronic component on the substrate.

In one or more embodiments, the second electronic component covers the second pad.

In one or more embodiments, the second electronic component does not cover the second pad.

In one or more embodiments, an orthogonal projection of the second pad on the substrate overlaps with an orthogonal projection of the second electronic component on the substrate.

In one or more embodiments, an orthogonal projection of the second pad on the substrate does not overlap with an orthogonal projection of the second electronic component on the substrate.

By using the redistribution layer to electrically interconnect the pads, the substrate and the stacked electronic components are electrically connected to each other. Compared to wire bonding, the issue that different wires may be shorted is avoided, and the size of the stacked semiconductor structure can be reduced because the stacked semiconductor structure is without the wires, which occupy a lot of space.

In addition, because the stacked semiconductor structure does not include through-silicon vias (TSVs), which are expensive, the manufacturing cost of the stacked semiconductor structure can be effectively reduced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
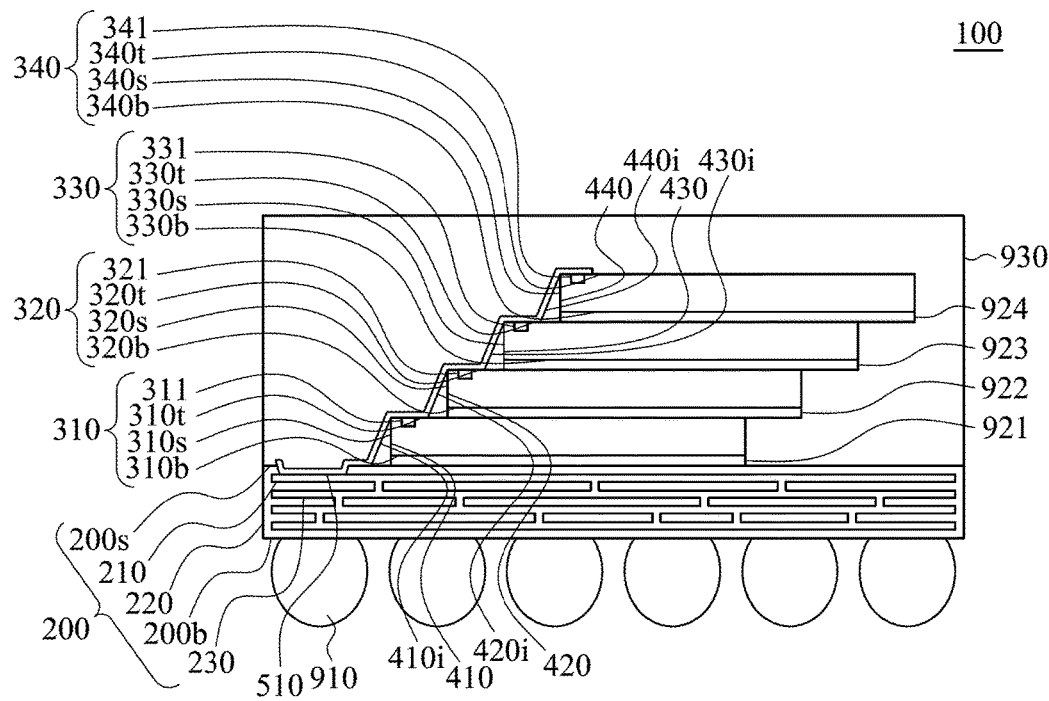
FIG. 1 is a schematic cross-sectional view of a stacked semiconductor structure according to one embodiment of this disclosure.

FIG. 1 is a schematic cross-sectional view of a stacked semiconductor structure 100 according to one embodiment of this disclosure. As shown in FIG. 1, a stacked semiconductor structure 100 is provided. In some embodiments, the stacked semiconductor structure 100 is a package structure. The stacked semiconductor structure 100 may be manufactured in wafer-level or panel-level processes.

The stacked semiconductor structure 100 includes a substrate 200, electronic components 310, 320, 330, and 340, fillets 410, 420, 430, and 440, and a redistribution layer 510. The substrate 200 has a support surface 200s. The substrate 200 includes a pad 210 disposed on the support surface 200s.

The electronic component 310 is disposed on the support surface 200s and has a bottom surface 310b, a top surface 310t, and a side surface 310s connecting the bottom surface 310b and the top surface 310t. The electronic component 310 includes a pad 311 disposed on the top surface 310t. The fillet 410 is disposed on the support surface 200s and the side surface 310s and has an inclined surface 410i.

The electronic component 320 is disposed on the top surface 310t and has a bottom surface 320b, a top surface 320t, and a side surface 320s connecting the bottom surface 320b and the top surface 320t. The electronic component 320 includes a pad 321 disposed on the top surface 310t. The fillet 420 is disposed on the top surface 310t and the side surface 320s and has an inclined surface 420i.

In this embodiment, a substantial portion of the orthogonal projection of the electronic component 320 on the substrate 200 does not overlap with the orthogonal projection of the electronic component 310 on the substrate 200. In other words, the electronic component 320 is not aligned with the electronic component 310.

Further, the electronic component 320 does not cover the pad 311. Therefore, the orthogonal projection of the pad 311 on the substrate 200 does not overlap with the orthogonal projection of the electronic component 320 on the substrate 200.

The electronic component 330 is disposed on the top surface 320t and has a bottom surface 330b, a top surface 330t, and a side surface 330s connecting the bottom surface 330b and the top surface 330t. The electronic component 330 includes a pad 331 disposed on the top surface 330t. The fillet 430 is disposed on the top surface 320t and the side surface 330s and has an inclined surface 430i.

In this embodiment, a substantial portion of the orthogonal projection of the electronic component 330 on the substrate 200 does not overlap with the orthogonal projection of the electronic component 320 on the substrate 200. In other words, the electronic component 330 is not aligned with the electronic component 320.

Further, the electronic component 330 does not cover the pad 321. Therefore, the orthogonal projection of the pad 321 on the substrate 200 does not overlap with the orthogonal projection of the electronic component 330 on the substrate 200.

The electronic component 340 is disposed on the top surface 330t and has a bottom surface 340b, a top surface 340t, and a side surface 340s connecting the bottom surface 340b and the top surface 340t. The electronic component 340 includes a pad 341 disposed on the top surface 340t. The fillet 440 is disposed on the top surface 330t and the side surface 340s and has an inclined surface 440i.

In this embodiment, a substantial portion of the orthogonal projection of the electronic component 340 on the substrate 200 does not overlap with the orthogonal projection of the electronic component 330 on the substrate 200. In other words, the electronic component 340 is not aligned with the electronic component 330.

Further, the electronic component 340 does not cover the pad 331. Therefore, the orthogonal projection of the pad 331 on the substrate 200 does not overlap with the orthogonal projection of the electronic component 340 on the substrate 200.

The redistribution layer 510 is disposed on the support surface 200s, the top surfaces 310t, 320t, 330t, and 340t, and the inclined surfaces 410i, 420i, 430i, and 440i and electrically interconnects the pads 210, 311, 321, 331, and 341.

By using the redistribution layer 510 to electrically interconnect the pads 210, 311, 321, 331, and 341, the substrate 200 and the stacked electronic components 310, 320, 330, and 340 are electrically connected to each other. Compared to wire bonding, the issue that different wires may be shorted is avoided, and the size of the stacked semiconductor structure 100 can be reduced because the stacked semiconductor structure 100 is without the wires, which occupy a lot of space.

In addition, because the stacked semiconductor structure 100 does not include through-silicon vias (TSVs), which are expensive, the manufacturing cost of the stacked semiconductor structure 100 can be effectively reduced.

The substrate 200 further includes a body 220 and at least one redistribution layer 230 disposed in the body 220. The stacked semiconductor structure 100 further includes a plurality of solder balls 910 disposed on a surface 200b of the substrate 200 opposite to the support surface 200s.

In some embodiments, the electronic components 310, 320, 330, and 340 are chips. Embodiments of this disclosure are not limited thereto. The person having ordinary skill in the art can make proper modifications to the electronic components 310, 320, 330, and 340 depending on the actual application.

In this embodiment, the fillet 410 covers the side surface 310s. The fillet 420 covers the side surface 320s. The fillet 430 covers the side surface 330s. The fillet 440 covers the side surface 340s. Embodiments of this disclosure are not limited thereto. In some embodiments, the fillets 410, 420, 430, and 440 may not cover the side surfaces 310s, 320s, 330s, and 340s. The fillets 410, 420, 430, and 440 covering the side surfaces 310s, 320s, 330s, and 340s can protect the side surfaces 310s, 320s, 330s, and 340s.

The stacked semiconductor structure 100 further includes a die attachment 921 disposed between the support surface 200s and the bottom surface 310b, a die attachment 922 disposed between the top surface 310t and the bottom surface 320b, a die attachment 923 disposed between the top surface 320t and the bottom surface 330b, and a die attachment 924 disposed between the top surface 330t and the bottom surface 340b.

In some embodiments, the die attachments 921, 922, 923, and 924 and the fillets 410, 420, 430, and 440 are made of the same material. Embodiments of this disclosure are not limited thereto. The person having ordinary skill in the art can make proper modifications to the material of the die attachments 921, 922, 923, and 924 and the fillets 410, 420, 430, and 440 depending on the actual application.

The stacked semiconductor structure 100 further includes a package member 930 disposed on the support surface 200s and covering the electronic components 310, 320, 330, and 340.

In some embodiments, the redistribution layer 510 is made of copper. Embodiments of this disclosure are not limited thereto. The person having ordinary skill in the art can make proper modifications to the material of the redistribution layer 510 depending on the actual application.

Figure 2:
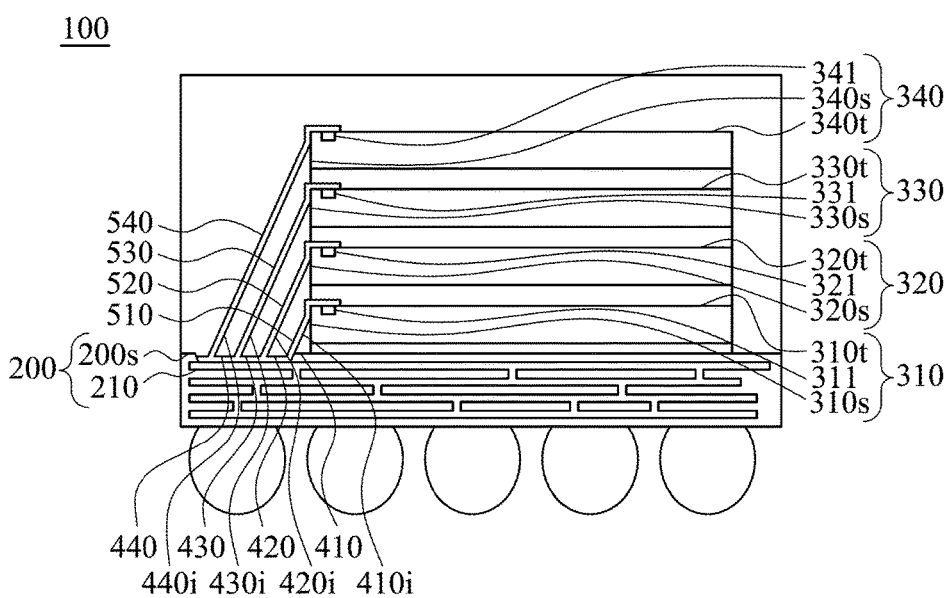
FIG. 2 is a schematic cross-sectional view of the stacked semiconductor structure according to another embodiment of this disclosure.

FIG. 2 is a schematic cross-sectional view of the stacked semiconductor structure 100 according to another embodiment of this disclosure. As shown in FIG. 2, the stacked semiconductor structure 100 of this embodiment is similar to the stacked semiconductor structure 100 of FIG. 1. The main differences between the two are described below.

The orthogonal projections of the electronic components 310, 320, 330, and 340 on the substrate 200 are substantially the same. In other words, the electronic components 310, 320, 330, and 340 are aligned with each other.

Further, the electronic component 320 covers the pad 311. The electronic component 320 covers the pad 311. The electronic component 330 covers the pad 321. The electronic component 340 covers the pad 331. Therefore, the orthogonal projection of the pad 311 on the substrate 200 overlaps with the orthogonal projection of the electronic component 320 on the substrate. The orthogonal projection of the pad 321 on the substrate 200 overlaps with the orthogonal projection of the electronic component 330 on the substrate. The orthogonal projection of the pad 331 on the substrate 200 overlaps with the orthogonal projection of the electronic component 340 on the substrate.

The fillet 420 is disposed on the inclined surface 410i. The fillet 430 is disposed on the inclined surface 420i. The fillet 440 is disposed on the inclined surface 430i.

The stacked semiconductor structure 100 further includes redistribution layers 520, 530, and 540. The redistribution layer 520 is disposed on the inclined surface 420i and the top surface 320t and electrically connects the pad 210 to the pad 321. The redistribution layer 530 is disposed on the inclined surface 430i and the top surface 330t and electrically connects the pad 210 to the pad 331. The redistribution layer 540 is disposed on the inclined surface 440i and the top surface 340t and electrically connects the pad 210 to the pad 341.

In addition, a part of the redistribution layer 510 is disposed between the fillets 410 and 420. A part of the redistribution layer 520 is disposed between the fillets 420 and 430. A part of the redistribution layer 530 is disposed between the fillets 430 and 440.

In this embodiment, the redistribution layers 510, 520, 530, and 540 are electrically isolated from each other. Embodiments of this disclosure are not limited thereto. In some embodiments, the redistribution layers 510, 520, 530, and 540 may be electrically connected to each other.

In this embodiment, at least a part of the side surface 310s is exposed by the fillet 410. At least a part of the side surface 320s is exposed by the fillet 420. At least a part of the side surface 330s is exposed by the fillet 430. At least a part of the side surface 340s is exposed by the fillet 440. By the above configuration, the issue that the electronic components 310, 320, 330, and 340 become cracked due to the forces generated by the fillets 410, 420, 430, and 440 can be avoided.

Further, the redistribution layer 510 is further disposed on the side surface 310s. The redistribution layer 520 is further disposed on the side surface 320s. The redistribution layer 530 is further disposed on the side surface 330s. The redistribution layer 540 is further disposed on the side surface 340s.

Figure 3:
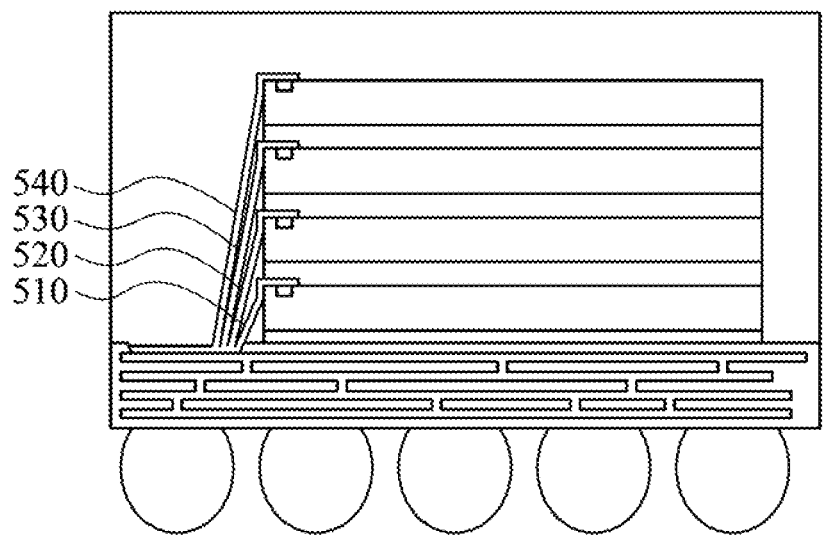
FIG. 3 is a schematic cross-sectional view of the stacked semiconductor structure according to another embodiment of this disclosure.

FIG. 3 is a schematic cross-sectional view of the stacked semiconductor structure 100 according to another embodiment of this disclosure. As shown in FIG. 3, the stacked semiconductor structure 100 of this embodiment is similar to the stacked semiconductor structure 100 of FIG. 2. The main difference between the two is that, in this embodiment, the redistribution layers 510, 520, 530, and 540 are electrically connected to each other.

Figure 4:
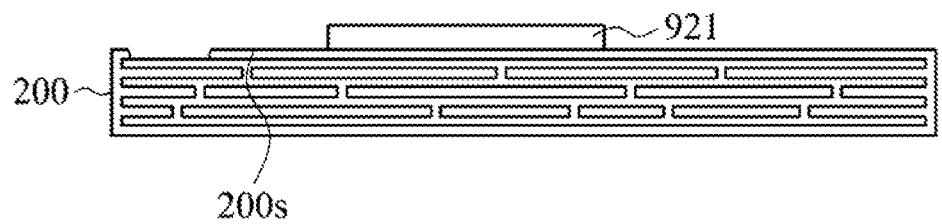
FIGS. 4 to 9 are schematic cross-sectional views of intermediate steps in processes for manufacturing the stacked semiconductor according to one embodiment of this disclosure.

FIGS. 4 to 9 are schematic cross-sectional views of intermediate steps in processes for manufacturing the stacked semiconductor 100 according to one embodiment of this disclosure. As shown in FIG. 4, a die attachment 921 is disposed on a support surface 200s of a substrate 200.

Figure 5:
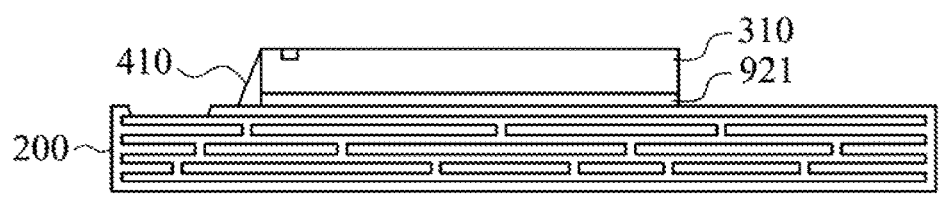

As shown in FIG. 5 an electronic component 310 is disposed on the die attachment 921 to compress the die attachment 921. Then, a part of the die attachment 921 is extruded to form a fillet 410, and the electronic component 310 is fixed to the substrate 200.

Figure 6:
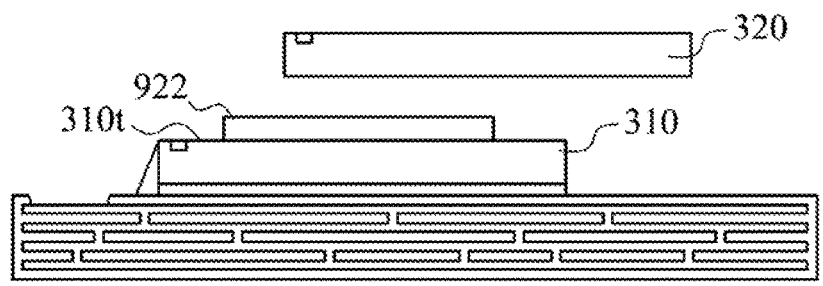

As shown in FIG. 6, similar to FIG. 4 and FIG. 5, a die attachment 922 is disposed on a top surface 310t of the electronic component 310. Then, an electronic component 320 is disposed on the die attachment 922, and the electronic component 320 is not aligned with the electronic component 310.

Figure 7:
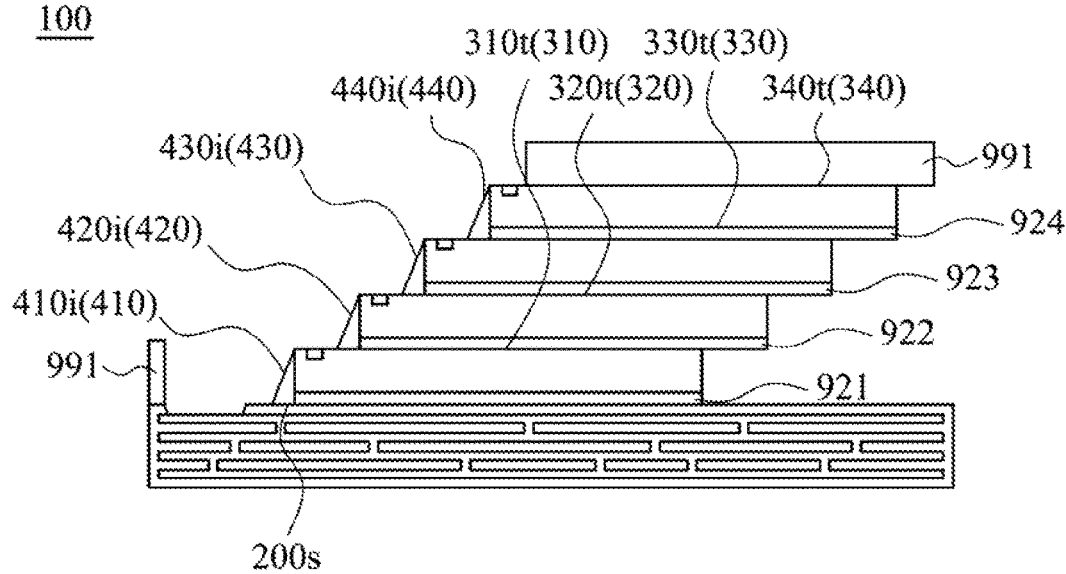

As shown in FIG. 7, operations similar to FIG. 4 to FIG. 6 are performed. Therefore, the electronic components 310, 320, 330, 340 are sequentially stacked, and the electronic components 310, 320, 330, and 340 are not aligned with each other. The die attachment 922 is disposed between the electronic components 310 and 320. The die attachment 923 is disposed between the electronic components 320 and 330. The die attachment 924 is disposed between the electronic components 330 and 340. The fillets 420, 430, and 440 are formed.

Then, a patterned photoresist 991 is formed on the support surface 200s of the substrate 200, an inclined surface 410i of the fillet 410, a top surface 310t of the electronic component 310, an inclined surface 420i of the fillet 420, a top surface 320t of the electronic component 320, an inclined surface 430i of the fillet 430, a top surface 330t of the electronic component 330, an inclined surface 440i of the fillet 440, and a top surface 340t of the electronic component 340.

Figure 8:
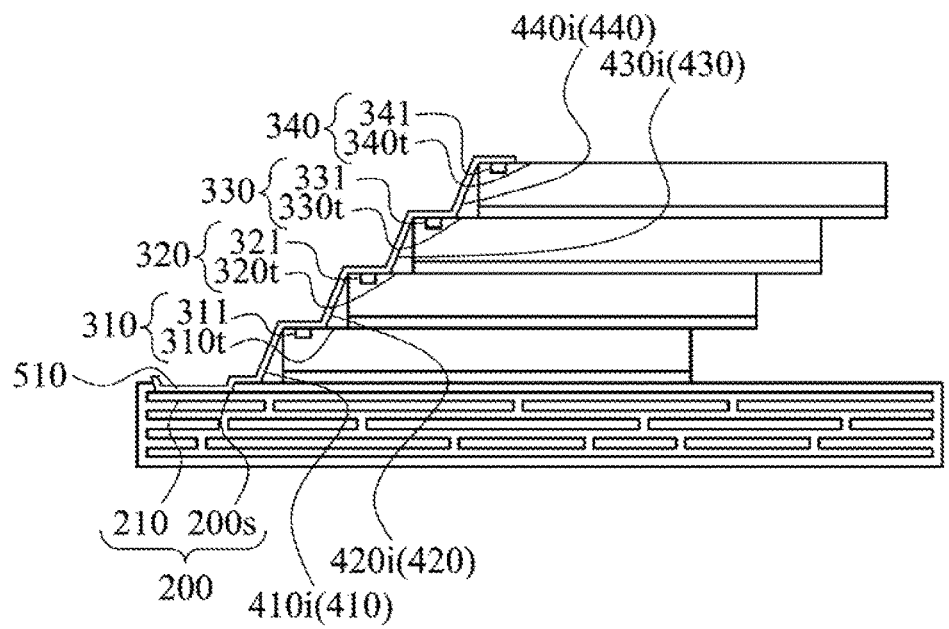

As shown in FIG. 8, a redistribution layer 510 is formed on a pad 210 and the support surface 200s of the substrate 200, the inclined surface 410i of the fillet 410, a pad 311 and the top surface 310*t* of the electronic component 310, the inclined surface 420*i* of the fillet 420, a pad 321 and the top surface 320*t* of the electronic component 320, the inclined surface 430*i* of the fillet 430, a pad 331 and the top surface 330*t* of the electronic component 330, the inclined surface 440*i* of the fillet 440, and a pad 341 and the top surface 340*t* of the electronic component 340. Then, the patterned photoresist 991 is removed. Therefore, the redistribution layer 510 electrically interconnects the pads 210, 311, 321, 331, and 341.

Figure 9:
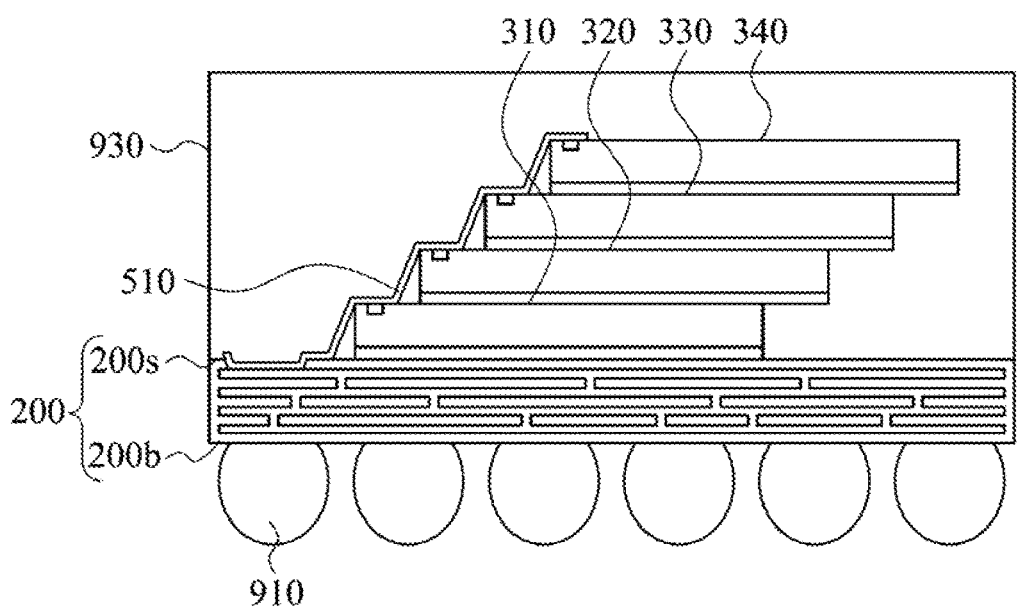

As shown in FIG. 9, a package member 930 is formed to cover the support surface 200*s*, the electronic components 310, 320, 330, and 340, and the redistribution layer 510. Then, a plurality of solder balls 910 are formed on a surface 200*b* of the substrate 200 opposite to the support surface 200*s*. The stacked semiconductor structure 100 in this embodiment may correspond to the stacked semiconductor structure 100 of FIG. 1.

Figure 10:
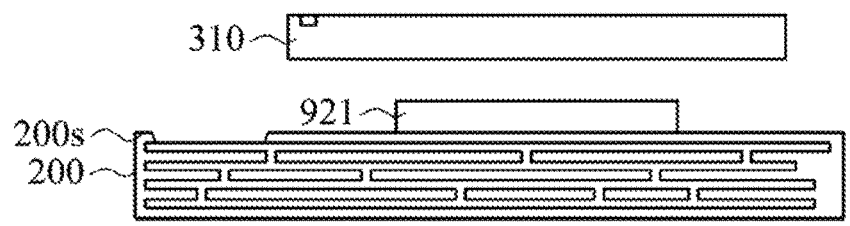
FIGS. 10 to 14 are schematic cross-sectional views of intermediate steps in processes for manufacturing the stacked semiconductor according to another embodiment of this disclosure.

FIGS. 10 to 14 are schematic cross-sectional views of intermediate steps in processes for manufacturing the stacked semiconductor 100 according to another embodiment of this disclosure. As shown in FIG. 10, a die attachment 921 is disposed on a support surface 200*s* of a substrate 200. Then, an electronic component 310 is disposed on the die attachment 921 to compress the die attachment 921.

Figure 11:
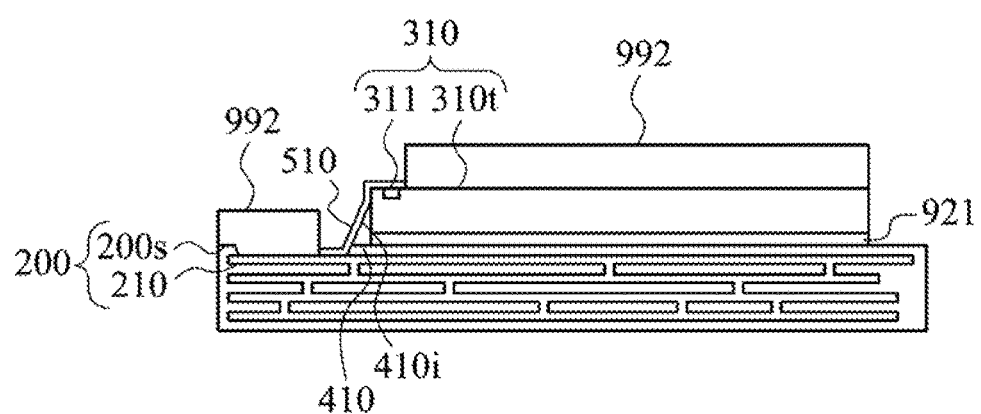

As shown in FIG. 11, a part of the die attachment 921 is extruded to form a fillet 410, and the electronic component 310 is fixed to the substrate 200. Then, a patterned photoresist 992 is formed on the support surface 200*s* of the substrate 200, an inclined surface 410*i* of the fillet 410, and a top surface 310*t* of the electronic component 310. Then, a redistribution layer 510 is formed on a pad 210 and the support surface 200*s* of the substrate 200, the inclined surface 410*i* of the fillet 410, and a pad 311 and the top surface 310*t* of the electronic component 310. Therefore, the redistribution layer 510 electrically connects the pad 210 to pad 311.

Figure 12:
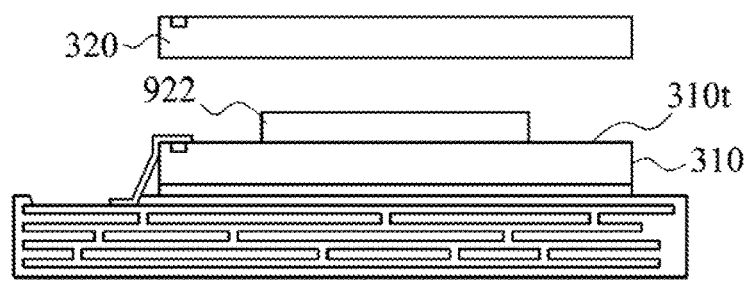

As shown in FIG. 12, similar to FIG. 10, after the patterned photoresist 992 is removed, a die attachment 922 is disposed on a top surface 310*t* of the electronic component 310. Then, an electronic component 320 is disposed on the die attachment 922, and the electronic component 320 is aligned with the electronic component 310.

Figure 13:
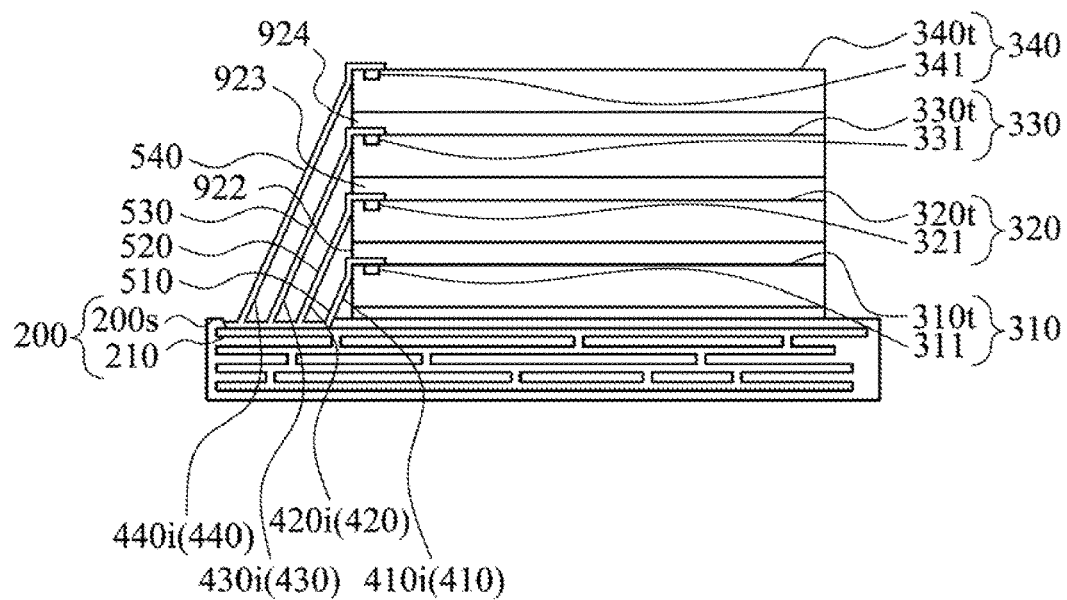

As shown in FIG. 13, operations similar to FIG. 10 to FIG. 12 are performed. Therefore, the electronic components 310, 320, 330, 340 are sequentially stacked, and the electronic components 310, 320, 330, and 340 are aligned with each other. The die attachment 922 is disposed between the electronic components 310 and 320. The die attachment 923 is disposed between the electronic components 320 and 330. The die attachment 924 is disposed between the electronic components 330 and 340. The fillet 420 is formed on an inclined surface 410*i* of the fillet 410. The fillet 430 is formed on an inclined surface 420*i* of the fillet 420. The fillet 440 is formed on an inclined surface 430*i* of the fillet 430. A redistribution layer 520 is formed on a pad 210 and the support surface 200*s* of the substrate 200, the inclined surface 420*i* of the fillet 420, and the pad 321 and the top surface 320*t* of the electronic component 310. A redistribution layer 530 is formed on the pad 210 and the support surface 200*s* of the substrate 200, the inclined surface 430*i* of the fillet 430, a pad 331 and the top surface 330*t* of the electronic component 330. A redistribution layer 540 is formed on the pad 210 and the support surface 200*s* of the substrate 200, the inclined surface 440*i* of the fillet 440, a pad 341 and the top surface 340*t* of the electronic component 340. Therefore, the redistribution layer 520 electrically connects the pads 210 to 321. The redistribution layer 530 electrically connects the pads 210 to 331. The redistribution layer 540 electrically connects the pads 210 to 341.

Figure 14:
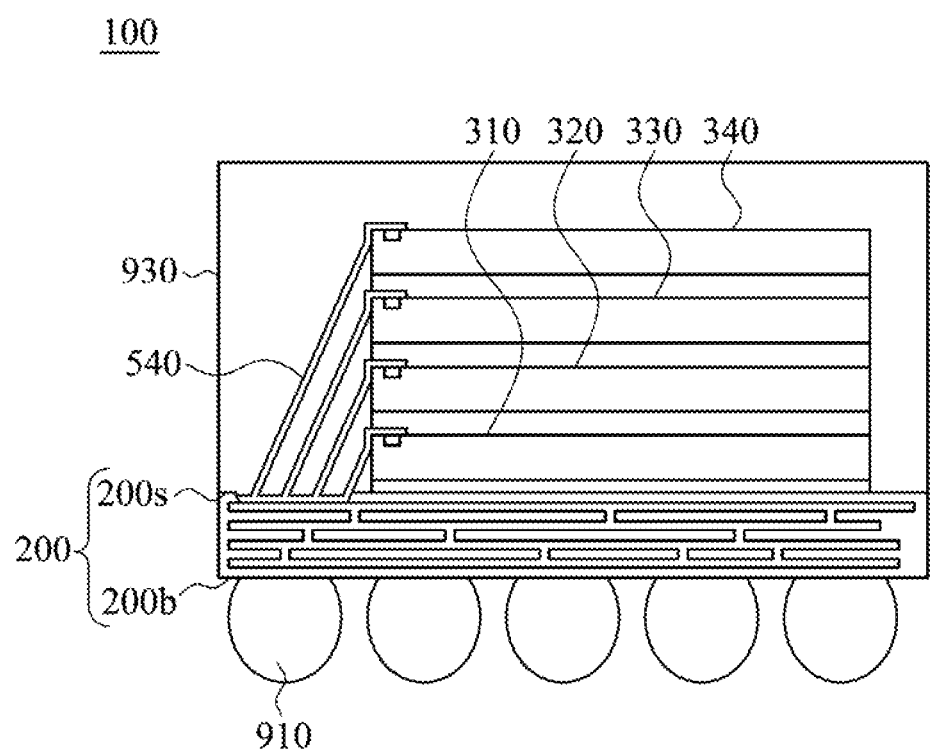

As shown in FIG. 14, a package member 930 is formed to cover the support surface 200*s*, the electronic components 310, 320, 330, and 340, and the redistribution layer 540. Then, a plurality of solder balls 910 are formed on a surface 200*b* of the substrate 200 opposite to the support surface 200*s*. The stacked semiconductor structure 100 in this embodiment may correspond to the stacked semiconductor structure 100 of FIG. 2.

By using the redistribution layer 510 to electrically interconnect the pads 210, 311, 321, 331, and 341, the substrate 200 and the stacked electronic components 310, 320, 330, and 340 are electrically connected to each other. Compared to wire bonding, the issue that different wires may be shorted is avoided, and the size of the stacked semiconductor structure 100 can be reduced because the stacked semiconductor structure 100 is without the wires, which occupy a lot of space.

In addition, because the stacked semiconductor structure 100 does not include through-silicon vias (TSVs), which are expensive, the manufacturing cost of the stacked semiconductor structure 100 can be effectively reduced.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A stacked semiconductor structure, comprising:
   a substrate having a support surface, wherein the substrate includes a first pad disposed on the support surface;
   a first electronic component disposed on the support surface and having a first bottom surface, a first top surface, and a first side surface connecting the first bottom surface and the first top surface, wherein the first electronic component includes a second pad disposed on the first top surface;
   a first fillet disposed on the support surface and the first side surface and having a first inclined surface;
   a first redistribution layer disposed on the support surface, the first top surface, and the first inclined surface and electrically connecting the first pad to the second pad; and
   a die attachment disposed between the support surface and the first bottom surface, wherein the die attachment and the first fillet are made of the same material.

2. The stacked semiconductor structure of claim 1, wherein the substrate further includes a body and at least one second redistribution layer disposed in the body.

3. The stacked semiconductor structure of claim 1, further comprising:
   a plurality of solder balls disposed on a surface of the substrate opposite to the support surface.

4. The stacked semiconductor structure of claim 1, further comprising:

a package member disposed on the support surface and covering the first electronic component.

5. The stacked semiconductor structure of claim 1, wherein the first electronic component is a chip.

6. The stacked semiconductor structure of claim 1, wherein the first fillet covers the first side surface.

7. The stacked semiconductor structure of claim 1, wherein the first redistribution layer is further disposed on the first side surface.

8. The stacked semiconductor structure of claim 1, further comprising:
a second electronic component disposed on the first top surface and having a second bottom surface, a second top surface, and a second side surface connecting the second bottom surface and the second top surface, wherein the second electronic component includes a third pad disposed on the second top surface; and
a second fillet disposed on the second side surface and having a second inclined surface.

9. The stacked semiconductor structure of claim 8, wherein the second fillet is further disposed on the first top surface, and the first redistribution layer is further disposed on the second inclined surface and the second top surface and further electrically connected to the third pad.

10. The stacked semiconductor structure of claim 8, wherein the second fillet is further disposed on the first inclined surface; and
further comprising:
a second redistribution layer disposed on the second inclined surface and the second top surface and electrically connecting the first pad to the third pad.

11. The stacked semiconductor structure of claim 10, wherein the first redistribution layer is electrically connected to the second redistribution layer.

12. The stacked semiconductor structure of claim 10, wherein the first redistribution layer is electrically isolated from the second redistribution layer.

13. The stacked semiconductor structure of claim 8, wherein an orthogonal projection of the first electronic component on the substrate and an orthogonal projection of the second electronic component on the substrate are substantially the same.

14. The stacked semiconductor structure of claim 8, wherein a substantial portion of an orthogonal projection of the second electronic component on the substrate does not overlap with an orthogonal projection of the first electronic component on the substrate.

15. The stacked semiconductor structure of claim 8, wherein the second electronic component covers the second pad.

16. The stacked semiconductor structure of claim 8, wherein the second electronic component does not cover the second pad.

17. The stacked semiconductor structure of claim 8, wherein an orthogonal projection of the second pad on the substrate overlaps with an orthogonal projection of the second electronic component on the substrate.

18. The stacked semiconductor structure of claim 8, wherein an orthogonal projection of the second pad on the substrate does not overlap with an orthogonal projection of the second electronic component on the substrate.

* * * * *